US008519417B2

(12) United States Patent
Jeong (10) Patent No.: US 8,519,417 B2
(45) Date of Patent: Aug. 27, 2013

(54) LIGHT EMITTING DEVICE (75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 240 days.

(21) Appl. No.: 12/724,922

(22) Filed: Mar. 16, 2010

(65) Prior Publication Data
US 2010/0230686 A1 Sep. 16, 2010

(30) Foreign Application Priority Data

Mar. 16, 2009 (KR) .................. 10-2009-0022086

(51) Int. Cl.
*H01L 33/00* (2010.01)
(52) U.S. Cl.
USPC ........ 257/98; 257/99; 257/100; 257/E33.064; 257/E33.066
(58) Field of Classification Search
USPC ............. 257/98–100, E33.064, E33.066
See application file for complete search history.

(56) References Cited

U.S. PATENT DOCUMENTS

| 6,956,884 | B1 * | 10/2005 | Nomura et al. ............ 372/46.01 |
| 2007/0298587 | A1 | 12/2007 | Park et al. .................... 438/458 |
| 2008/0108161 | A1 | 5/2008 | Chen ............................ 438/33 |
| 2008/0283821 | A1 | 11/2008 | Park et al. ........................ 257/13 |
| 2008/0291959 | A1 | 11/2008 | Tokunaga et al. .......... 372/45.01 |
| 2011/0241057 | A1 * | 10/2011 | Shen et al. ...................... 257/98 |

FOREIGN PATENT DOCUMENTS

| JP | 08-274369 A | 10/1996 |
| JP | 2005-64015 A | 3/2005 |
| KR | 10-0638823 B1 | 10/2006 |
| KR | 10-0682255 B1 | 2/2007 |
| KR | 10-2007-0118876 A | 12/2007 |

OTHER PUBLICATIONS

European Search Report dated Jul. 29, 2010 issued in Application No. 10 15 6540.
Korean Office Action dated Apr. 27, 2011 issued in Application No. 10-2009-0022086.

* cited by examiner

*Primary Examiner* — Samuel Gebremariam
(74) *Attorney, Agent, or Firm* — KED & Associates, LLP (57) ABSTRACT

Disclosed are a light emitting device and a method of manufacturing the same. The light emitting device includes a plurality of compound semiconductor layers that includes a first conductive semiconductor layer, an active layer under the first conductive semiconductor layer, and a second conductive semiconductor layer under the active layer. An electrode is formed on the compound semiconductor layers. A groove is formed at an upper portion of the compound semiconductor layers. An electrode layer is formed under the compound semiconductor layers.

20 Claims, 12 Drawing Sheets

LIGHT EMITTING DEVICE

CROSS-REFERENCE TO RELATED APPLICATIONS

The present application claims priority under 35 U.S.C. §119 to Korean Patent Application No. 10-2009-0022086 filed on Mar. 16, 2009, which is hereby incorporated by reference in its entirety.

BACKGROUND

Embodiments relate to a light emitting device.

II-V group nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device, in which a semiconductor layer can be prevented from energy applied by a laser beam when a substrate is separated.

The embodiment provides a light emitting device, in which an oxide layer having a band gap lower than that of the semiconductor layer can be formed between the substrate and the semiconductor layer.

An embodiment provides a light emitting device comprising: a first conductive semiconductor layer; an active layer under the first conductive semiconductor layer; a second conductive semiconductor layer under the active layer; a first electrode over the first conductive semiconductor layer; at least one groove formed on an upper surface of the first conductive semiconductor layer; a material having a band gap in a range of 2.5 eV to 3.0 eV provided in the groove; and a second electrode layer under the second conductive semiconductor layer.

An embodiment provides a light emitting device comprising: a first conductive semiconductor layer, wherein the first conductive material has a first width and a second width, and a difference in width of the first and second width is no greater than 100 um, and the difference in width forms a step profile or a slanted profile around a periphery of the first semiconductor layer; an active layer under the first conductive semiconductor layer; a second conductive semiconductor layer under the active layer; a first electrode over the first conductive semiconductor layer; and a second electrode layer under the second conductive semiconductor layer.

The details of one or more embodiments are set forth in the accompanying drawings and the description below. Other features will be apparent from the description and drawings, and from the claims.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings. The thickness and size of each layer shown in the drawings can be exaggerated, omitted or schematically drawn for the purpose of convenience or clarity. In addition, the size of elements does not utterly reflect an actual size.

FIGS. 1 to 15 are views showing the manufacturing process of a light emitting device 100 according to a first embodiment.

Figure 1:
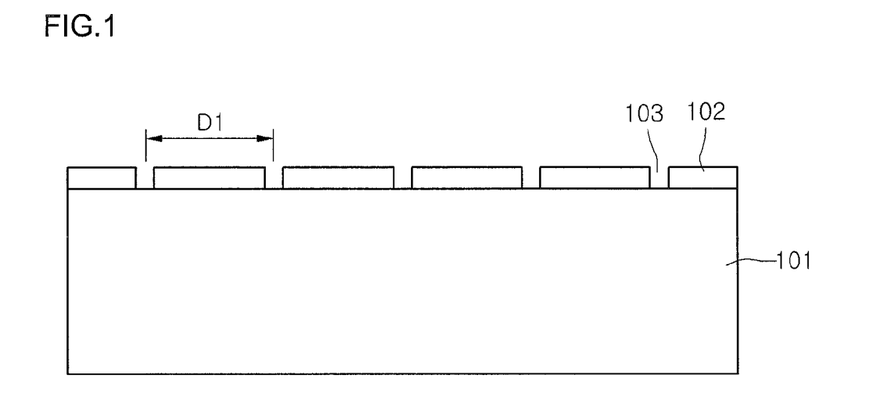
FIGS. 1 to 15 are views showing the manufacturing process of a light emitting device according to a first embodiment.

Referring to FIG. 1, a mask layer 102 is formed on a substrate 101.

The substrate 101 may include a material selected from the group consisting of a sapphire substrate ($AL_2O_3$), GaN, SiC, ZnO, Si, GaP, InP, GaAs, and $Ga_2O_3$. A concave-convex structure can be formed on the substrate 101, but the embodiment is not limited thereto.

The mask layer 102 includes $SiO_2$, $SiO_x$, $SiN_x$, or $SiO_xN_y$, and is formed at a predetermined thickness. The mask layer 102 is formed therein with a plurality of holes 103. The holes 103 are spaced apart from with a distance D1 on the substrate 101.

The distance between the holes 103 may be a chip size or less. The holes 103 may be formed corresponding to a channel region of a chip. The holes 103 may have the form of a matrix. The channel surrounds each chip while forming a boundary between chips.

Figure 2:
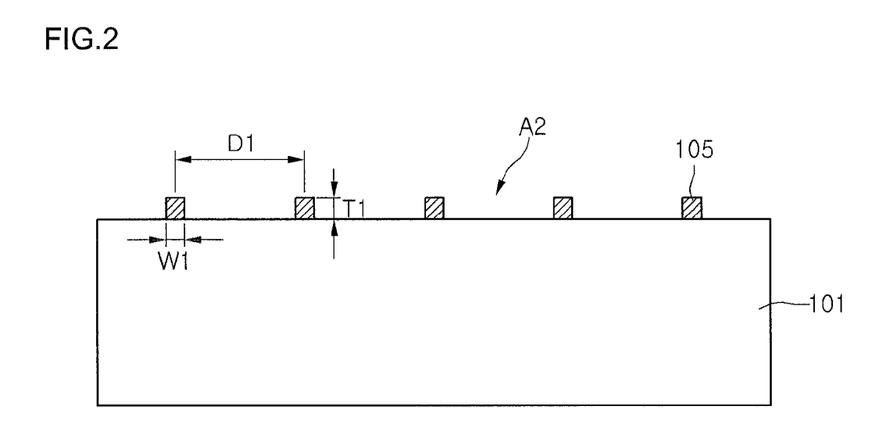

Referring to FIGS. 1 and 2, an oxide layer 105 is formed in each hole 103 of the mask layer 102. After the oxide layer 105 has been formed, the mask layer 102 is removed. A region in the oxide layer 105 may be a chip region A2. A size of a chip has a size of an about 0.3 mm~4 mm to 0.3 mm~4 mm, but is not limited to chip size.

The oxide layer 105 may include a material having a band gap lower than that of a compound semiconductor. For example, the oxide layer 105 may include a material such as $W_xO_y$ ($0<x$, $0<y$), $Mo_aO_b$ ($0<a$, $0<b$). A band gap of the compound semiconductor such as GaN is 3.4 eV, and a band gap of the $W_xO_y$ and $Mo_aO_b$ is in the range of 2.5 eV to 3.0 eV. The embodiment includes an oxide layer having a band gap of 3.4 eV or less, but is not limited to $W_xO_y$ and $Mo_aO_b$.

The oxide layer 105 may have a width W1 (100 µm$\geq$W1$\geq$0.01 µm), and a thickness T1 (1 µm$\geq$W1$\geq$0.01

μm). The width W1 and the thickness T1 may be set as values sufficient to grow the nitride semiconductor on the substrate 101.

The oxide layer 105 may be formed through a sputtering scheme to apply tungsten (W) and oxygen (O₂). When the oxide layer 105 is formed, or after the oxide layer 105 has been formed, an annealing process may be performed by applying oxygen gas (O₂), nitrogen gas (N₂), or argon gas (Ar).

The oxide layer 105 may have a thickness lower than that of a first conductive semiconductor layer of a compound semiconductor layer 110, but the embodiment is not limited thereto.

Figure 3:
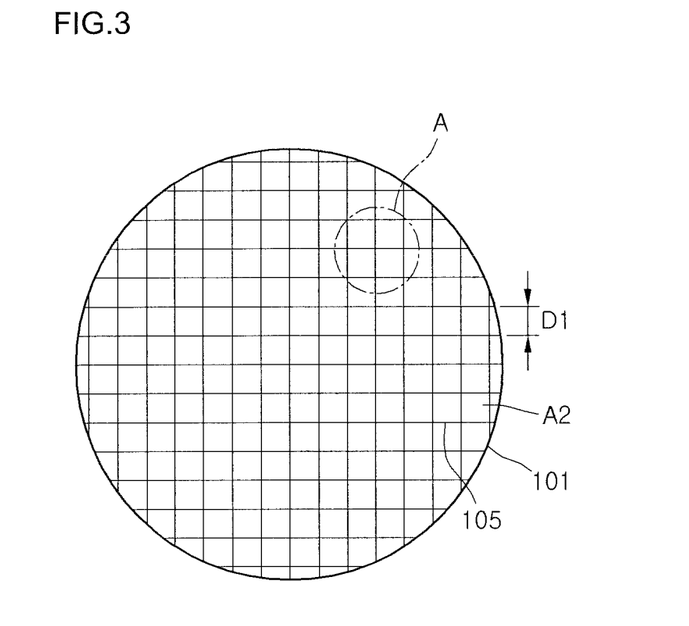
Figure 4:
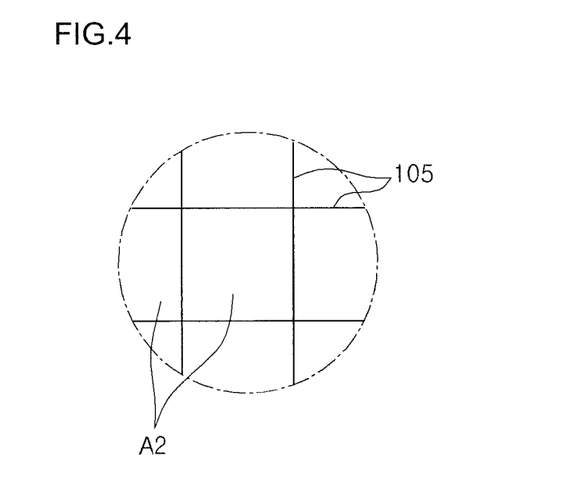
Figure 6:
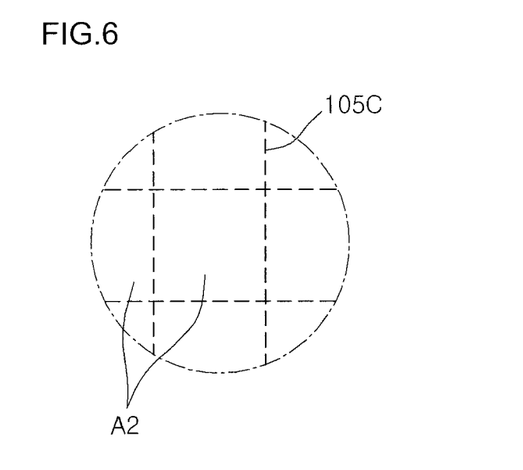

FIG. 3 is a plan view showing the substrate 101 of FIG. 2, and FIGS. 4 and 6 are enlarged views showing a region A of FIG. 3.

Referring to FIGS. 3 and 4, the oxide layer 105 may have a line pattern with a predetermined interval D1 in the form of a matrix on the substrate 101 as shown in FIG. 3.

Figure 5:
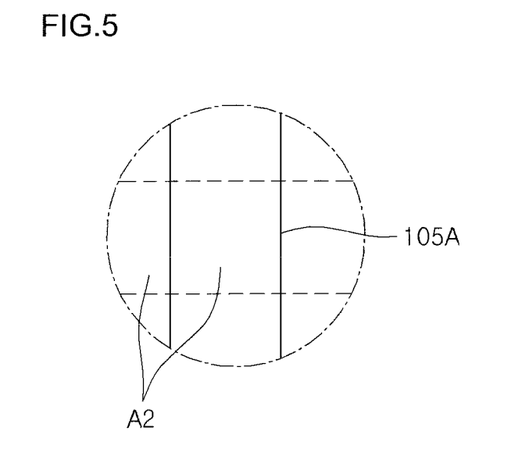

FIG. 5 is a view showing an oxide layer 105A having a pattern different from that of the oxide layer 105 of FIG. 4.

Referring to FIG. 5, the oxide layer 105A may be formed in channel regions longitudinally extending at the left/right of a chip region A2. In other words, the oxide layer 105A may be not formed at all sides of the chip region A2, but formed at both sides of the chip region A2 facing each other.

FIG. 6 is a view showing an oxide layer 105C having a pattern different from that of the oxide layer 105C of FIG. 4. Referring to FIG. 6, an oxide layer 105C may have concave-convex patterns spaced apart from each other with a predetermined distance at a peripheral channel region of the chip region A2.

Figure 7:
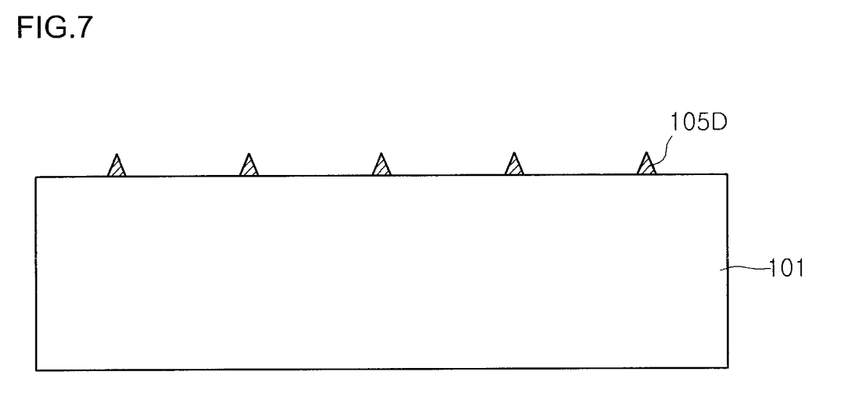

FIG. 7 is a view showing an oxide layer 105D having a shape different from that of the oxide layer 105 of FIG. 2.

Referring to FIG. 7, the oxide layer 105D may have a triangular cross section, and the cross section of the oxide layer 105D may have a pyramid shape such as a triangle shape, a rectangle shape, and a horn shape, but the embodiment is not limited thereto.

Figure 8:
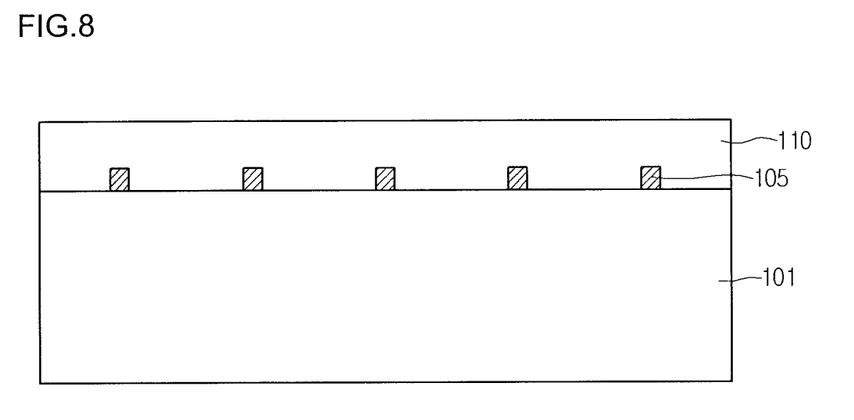

Referring to FIG. 8, the compound semiconductor layer 110 is formed on the substrate 101. The compound semiconductor layer 110 may be grown by an electronic beam depositor, physical vapor deposition (PVD), chemical vapor deposition (CVD), plasma laser deposition (PLD), a dual-type thermal evaporator, sputtering, or metal organic chemical vapor deposition (MOCVD), but the embodiment is not limited thereto.

The compound semiconductor layer 110 may have a stack structure of a plurality of semiconductor layers including elements of group III-V. The compound semiconductor layer 110 has a composition equation of $In_xAl_yGa_{1-x-y}N$ ($0 \leq x \leq 1$, $0 \leq y \leq 1$, $0 \leq x+y \leq 1$).

Figure 9:
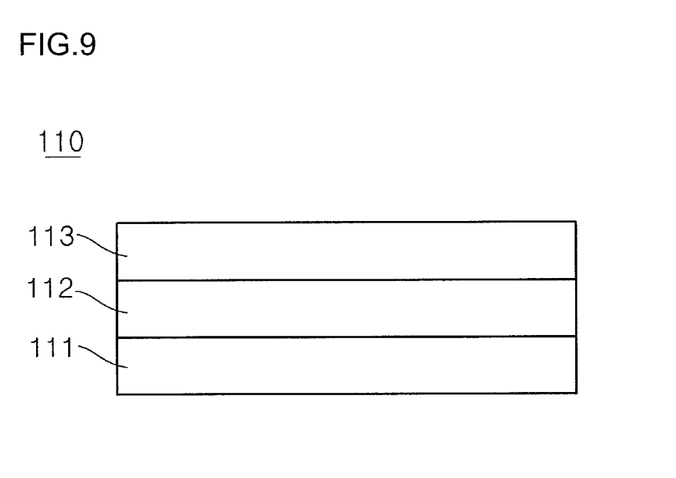

FIG. 9 is view showing the compound semiconductor layer 110 of FIG. 8 in detail.

Referring to FIG. 9, the compound semiconductor layer 110 may have a structure in which a first conductive semiconductor layer 111, an active layer 112, and a second conductive semiconductor layer 113 are sequentially stacked on each other.

The first conductive semiconductor layer 111 may be an N-type semiconductor layer, and the second conductive semiconductor layer 113 may be a P-type semiconductor layer. In contrast, the first conductive semiconductor layer 111 may be a P-type semiconductor layer, and the second conductive semiconductor layer 113 may be an N-type semiconductor layer.

The N-type semiconductor layer may include at least one of GaN, InN, AlN, InGaN, AlGaN, InAlGaN, and AlInN, and include N-type dopants such as Si, Ge, Sn, Se, or Te. The active layer 112 may have a single quantum well (SQW) structure, a multiple quantum well (MQW) structure, a quantum wire structure, and a quantum dot structure. The active layer 112 includes III-V group compound semiconductors. A well layer/barrier layer of the active layer 112 may include a pair structure of InGaN/GaN, GaN/AlGaN, or InGaN/InGaN, but the embodiment is not limited thereto. The well layer may include a material having a band gap lower than that of the barrier layer.

A clad layer may be formed on/under the active layer 112. According to the embodiment, layers may be added, and the structure may be modified.

The P-type semiconductor layer may include at least one of GaN, InN, AlN, InGaN, AlGaN, InAlGaN, and AlInN, and may be doped with a P-type dopant such as Mg, Zn, Ca, Sr, or Ba.

Another III-V group compound semiconductor layer such as a buffer layer or a clad layer may be formed on and/or under the layers 111, 112, and 113. Another layer may be added within the technical scope of the embodiment, but the embodiment is not limited thereto.

Accordingly, the compound semiconductor layer 110 may have an N—P junction structure, or a P—N junction structure.

Figure 10:
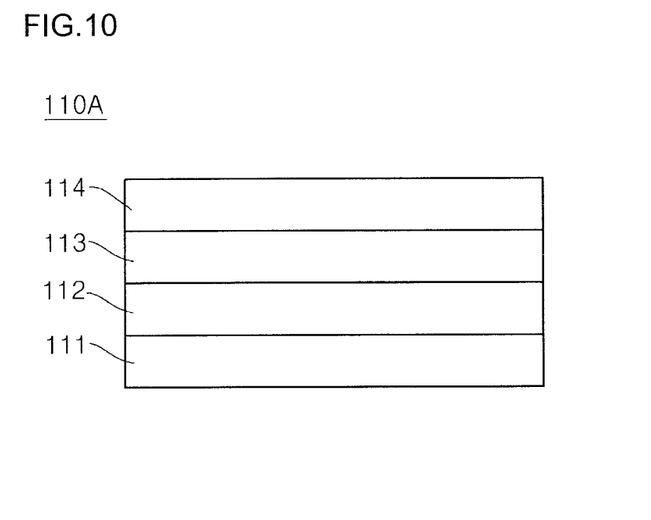

FIG. 10 is a view showing a compound semiconductor layer 110A different from the semiconductor layer 110 of FIG. 8.

The compound semiconductor layer 110A includes the first conductive semiconductor layer 111, the active layer 112, the second conductive semiconductor layer 113, and a third conductive semiconductor layer 114. The third conductive semiconductor layer 114 may have a polarity different from that of the second conductive semiconductor layer 113. The first conductive semiconductor layer 111 may be a first N-type semiconductor layer. The second conductive semiconductor layer 113 may be a P-type semiconductor layer. The third conductive semiconductor layer 114 may be a second N-type semiconductor layer. Accordingly, the compound semiconductor layer 110A may have an N—P—N junction structure, and a P—N—P junction structure.

Figure 11:
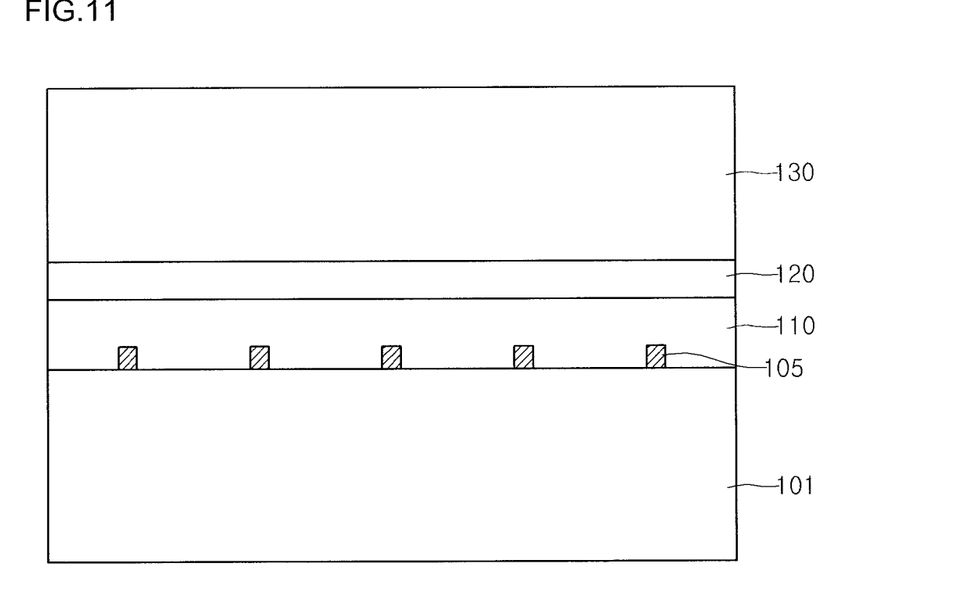

Referring to FIGS. 8 and 11, an electrode layer 120 may be formed on the compound semiconductor layer 110, and a conductive support member 130 may be formed on the electrode layer 120.

The electrode layer 120 may include a material selected from the group consisting of Ag, Ni, Al, Rh, Pd, Ir, Ru, Mg, Zn, Pt, Au, Hf, and the combination thereof, and may include at least one layer. The conductive support member 130 may be formed through electrolytic plating. The conductive support member 130 may include alloys consisting of at least two of Ni, Cu, Cr, Fe, Si, Mo, and Co. Among the alloys, the conductive support member 130 may selectively include alloys having a lower thermal expansion coefficient, higher heat conductivity, and a superior conductive characteristic. The conductive support member 130 may include Cu, Ag, or a carrier wafer (including Si, Ge, GaAs, ZnO, SiC, or SiGe, GaN). The conductive support member 130 may be formed through electrolytic plating, but the embodiment is not limited thereto. The conductive support member 130 may be bonded with the electrode layer 120, but the embodiment is not limited thereto.

The electrode layer 120 and the conductive support member 130 may be realized by selectively using conductive materials such as an oxide material and a metallic material, but may include various materials within the technical scope of the embodiment. An ohmic layer may be formed between the electrode layer 120 and the compound semiconductor layer 110. The ohmic layer may have a single layer or a multiple layer including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

Figure 12:
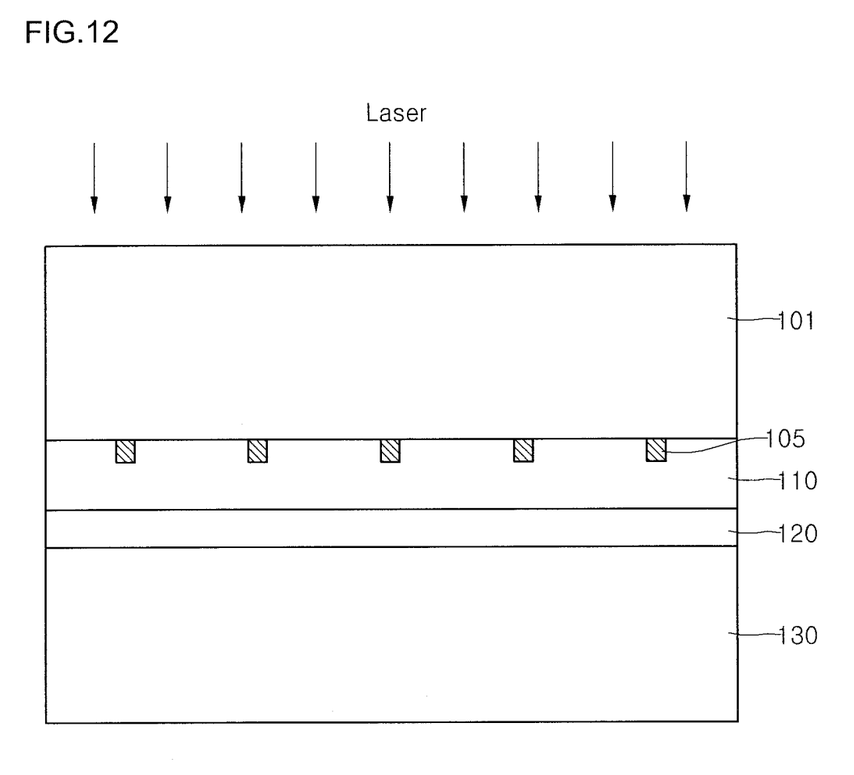

Referring to FIGS. 11 and 12, after the conductive support member 130 has been formed on the compound semiconductor layer 110, the conductive support member 130 is placed at a lower portion of a chip, and the substrate 101 is placed at an upper portion of the chip. Then, the substrate 101 is removed. In this case, the substrate 101 is removed through a laser lift off (LLO) scheme. Through the LLO scheme, a laser beam having a predetermined wavelength is irradiated with respect to the substrate 101 to concentrate heat energy at the boundary between the substrate 101 and the compound semiconductor layer 110, such that the substrate 101 is removed.

The laser may be an Excimer laser comprising a KrF laser or an ArF laser. For example, the KrF laser proving a wavelength of about 248 nm or the ArF laser proving a wavelength of about 193 nm may be used. The KrF layer may be used when the interfacial material (e.g., GaN layer) disposed on the substrate 101 has a lower band gap than the substrate 101. The ArF layer may be used when an interfacial material (e.g., AlN buffer layer) disposed on the substrate 101 has a higher band gap than the substrate 101.

Figure 13:
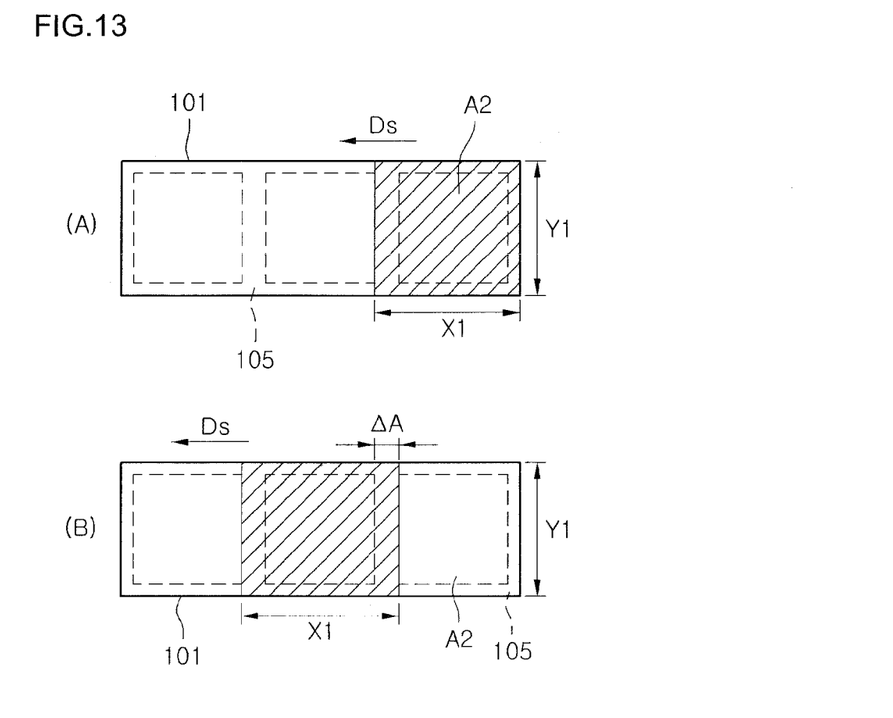

FIG. 13 is a view showing one example of a scanning scheme of the laser of FIG. 12.

Referring to FIGS. 12 and 13, the laser performs scanning in a predetermined direction Ds in the unit of a scan region having an area of X1*Y1. The laser can perform scanning one time or more.

The size of the scan region includes the size of the target region A2 and the size of an outer region ΔA formed around the target region A2. This represents that the outer region ΔA in addition to the target region A2 is scanned by using the laser. If the scan region is approximately identical to the size of the chip, the target region A2 may be a chip region, and the outer region ΔA may be a channel region.

The outer region ΔA is repeatedly scanned in the laser scan. Accordingly, the energy of the laser may be concentrated in the channel region ΔA. In this case, the channel region ΔA may be damaged, and such damage may cause the degradation in the reliability for the chip and chip failure.

According to the embodiment, the oxide layer 105 is formed in the channel region ΔA, such that the oxide layer 105 absorbs energy of a laser beam irradiated into the channel region ΔA. In other words, the band gap of the oxide layer 105 is in the range of 2.5 eV to 3.0 eV. The band gap of the oxide layer 105 is lower than a band gap of a nitride semiconductor, so that the oxide layer absorbs the energy of the laser beam. Accordingly, the density of energy delivered to the nitride semiconductor through the oxide layer 105 is reduced. Therefore, the semiconductor device can be prevented from being defected, and the reliability for the chip can be improved.

Figure 14:
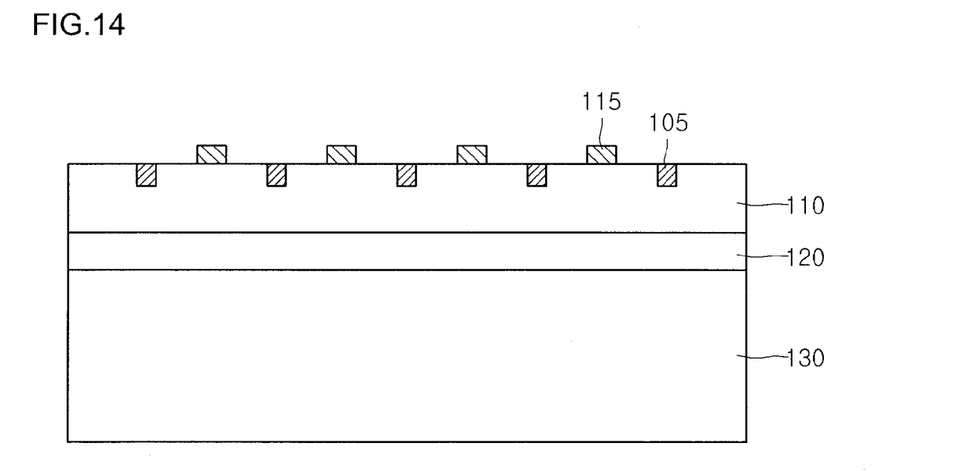

Referring to FIGS. 12 and 14, after the substrate 101 has been separated, an isolation etching is performed with respect to the compound semiconductor layer 110 to expose the channel region. The etching scheme may include a dry etching or a wet etching.

An electrode 115 may be formed on the compound semiconductor layer 110, and may have a predetermined pattern on the compound semiconductor layer 110. A roughness may be formed on the compound semiconductor layer 110, but the embodiment is not limited thereto. The electrode 115 may be formed after or before a chip dicing process is performed, but the embodiment is not limited thereto.

Figure 15:
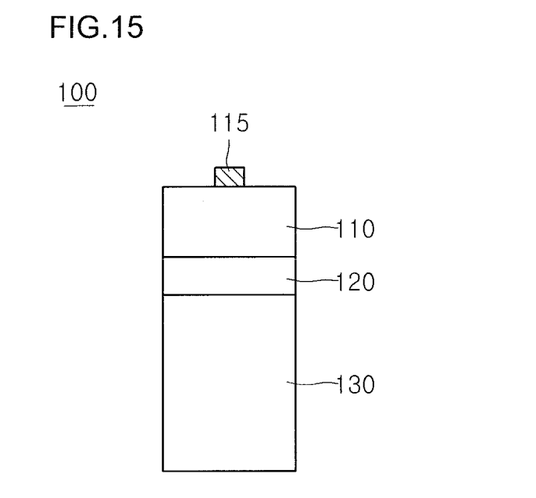

The compound semiconductor layer 110 is divided in a chip unit through an expanding & breaking process after the isolation etching has been performed. After the compound semiconductor layer 110 has been divided in the chip unit, the light emitting device 100 having the form of a chip shown in FIG. 15 is manufactured.

Although the embodiment has been described by employing a light emitting device (e.g., LED) as an example, the embodiment can be adapted to another semiconductor device formed on a substrate. Such a technical feature is not limited to the embodiment.

Figure 16:
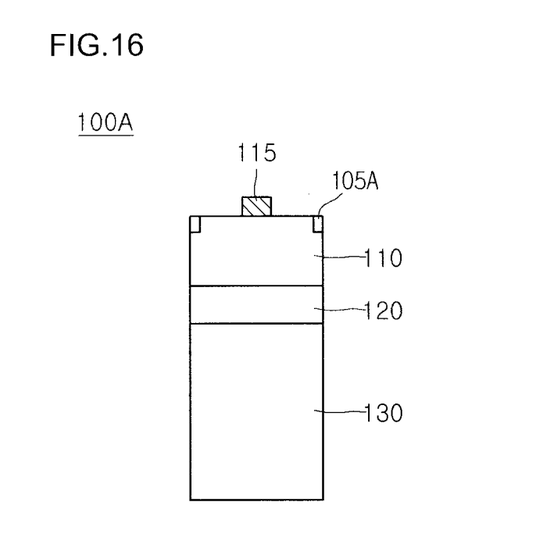
FIG. 16 is a side sectional view showing a light emitting device according to a second embodiment.

FIG. 16 is a side sectional view showing a light emitting device 100A according to the second embodiment. Hereinafter, the second embodiment will be described while focusing on the difference between the second embodiment and the first embodiment in order to avoid redundancy.

Referring to FIG. 16, in the light emitting device 100A, a groove 105A may be formed around a peripheral portion of the compound semiconductor layer 110. The groove 105A may be formed around an upper peripheral portion of the compound semiconductor layer 110. The groove 105A may be formed therein the first conductive semiconductor layer of the first conductive semiconductor layer 110, but the embodiment is not limited thereto. A plurality of the grooves 105A are formed at an upper surface of the first conductive semiconductor layer and spaced apart from each other. The groove 105A has a continuous loop shape or a discontinuous loop shape in the first conductive semiconductor layer. An oxide material or an insulation material may be partially provided in the groove 105A. The groove 105A may have a width W1 (100 μm≧W1≧0.01 μm), and a thickness T1 (1 μm≧W1≧0.01 μm).

A critical angle of light emitted in the compound semiconductor layer 110 can be changed by the groove 105A, so that the light extraction efficiency can be improved.

Figure 17:
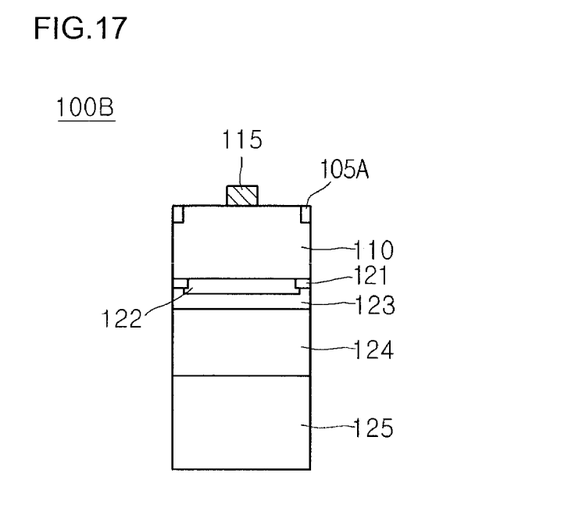
FIG. 17 is a side sectional view showing a light emitting device according to a third embodiment.

FIG. 17 is a side sectional view showing a light emitting device 100B according to a third embodiment. Hereinafter, the third embodiment will be described while focusing on the difference between the above disclosed embodiments and the third embodiment in order to avoid redundancy.

Referring to FIG. 17, in the light emitting device 100B, the groove 105A is formed around a peripheral portion of the compound semiconductor layer 110. A channel layer 121, an ohmic layer 122, a reflective electrode layer 123, a bonding layer 124, and a conductive support member 125 are formed under the compound semiconductor layer 110.

The groove 105A and the channel layer 121 face each other at both sides of the compound semiconductor layer 110, and the interval between the groove 105A and the channel layer 121 varies depending on a chip size and a laser scan region.

The channel layer 121 and the ohmic layer 122 are formed under the second conductive semiconductor layer 113.

The channel layer 121 may be formed in a loop pattern, a ring pattern, or a frame pattern along a lower peripheral portion of the compound semiconductor layer 110. The channel layer 121 may have the form of continuous or discontinuous patterns.

The channel layer 121 may include a light transmissive oxide, a light transmissive nitride, or a light transmissive insulating layer having a refractive index lower than that of III-V group compound semiconductors. The channel layer 121 may include ITO, IZO, IZTO, IAZO, IGZO, IGTO, AZO, ATO, GZO, $SiO_2$, $SiO_x$, $SiO_xN_y$, $Si_3N_4$, $Al_2O_3$, or $TiO_2$ The channel layer 121 can prevent a short phenomenon when an outer wall of the compound semiconductor layer 110 is exposed to moisture. Accordingly, an LED having a strong moisture-resistance can be provided. If the channel layer 121 includes a transmissive material, a laser beam is transmitted in a laser scribing process, so that the channel layer 121 prevents metal from being fragmented due to the laser beam. Accordingly, an inter-layer short problem can be prevented on the sidewall of the compound semiconductor layer 110.

The channel layer 121 may widen the gap between an outer wall of the compound semiconductor layer 110 and another metallic layer such as the bonding layer 124.

The ohmic layer 122 makes ohmic-contact with the compound semiconductor layer 110, and the ohmic layer 122 may extend beyond the lower portion of the channel layer 121, but the embodiment is not limited thereto. The ohmic layer 122 may include at least one of ITO, IZO, IZTO, IAZO, IGZO, IGTO, AZO, ATO, GZO, IrOx, RuOx, RuOx/ITO, Ni/IrOx/Au, Ni/IrOx/Au/ITO, Pt, Ni, Au, Rh, and Pd.

A current blocking layer may be formed under the compound semiconductor layer 110. The current blocking layer has a predetermined pattern corresponding to the position of the electrode 115. The current blocking layer may include a material having conductivity lower than that of the ohmic layer 122. The current blocking layer may include ITO, IZO, IZTO, IAZO, IGZO, IGTO, AZO, ATO, GZO, $SiO_2$, $SiO_x$, $SiO_xN_y$, $Si_3N_4$, $Al_2O_3$, or $TiO_2$.

The reflective electrode layer 123 is formed under the ohmic layer 122 such that incident light is reflected. The reflective electrode layer 123 has at least layer including Ag, Ni, Al, Rh, Pd, Ir, Ru, Mg, Zn, Pt, Au, Hf, or alloy of at least two above materials. The reflective electrode layer 123 may include seed metal, and the seed metal is used in a plating process. Accordingly, the reflective electrode layer 123 may include an ohmic layer, a seed layer, or an electrode layer. In this case, an ITO ohmic layer may not be formed.

The reflective electrode layer 123 may cover the entire portion of a bottom surface of the channel layer 121, or may be formed with a width corresponding to 80% or less of the width of the bottom surface of the channel layer 121.

The reflective electrode layer 123 may be formed with a width (i.e, diameter) greater than that of the active layer. In this case, incident light can be effectively reflected, so that light extraction efficiency can be improved.

The bonding layer 124 is formed under the reflective electrode layer 123. An outer portion of the bonding layer 124 may make contact with a lower portion of the channel layer 121, but the embodiment is not limited thereto. The bonding layer 124 includes barrier metal or bonding metal. For example, the bonding layer 124 may include at least one of Ti, Au, Sn, Ni, Cr, Ga, In, Bi, Cu, Ag and Ta.

The bonding layer 124 may serve as a junction layer, so that the conductive support member 125 is bonded with the lower portion of the bonding layer 124. Instead of the bonding layer 124, the conductive support member 125 can be attached to the reflective electrode layer 123 through plating or by using a sheet.

The conductive support member 125 is formed under the bonding layer 124. The conductive support member 125 serves as a base substrate, and includes Cu, Au, Ni, Mo, Cu—W, or a carrier wafer including Si, GaAs, ZnO, SiC, SiGe, or GaN. The conductive support member 125 may be not formed, or may be realized by using a conductive sheet.

The outer portion of the compound semiconductor layer 110 may be covered with an insulating material. The insulating material may include an insulating material, such as $SiO_2$, $SiO_x$, $SiO_xN_y$, $Si_3N_4$, $Al_2O_3$, or $TiO_2$, having a refractive index lower than that of the compound semiconductor (GaN having a refractive index of 2.4).

Figure 18:
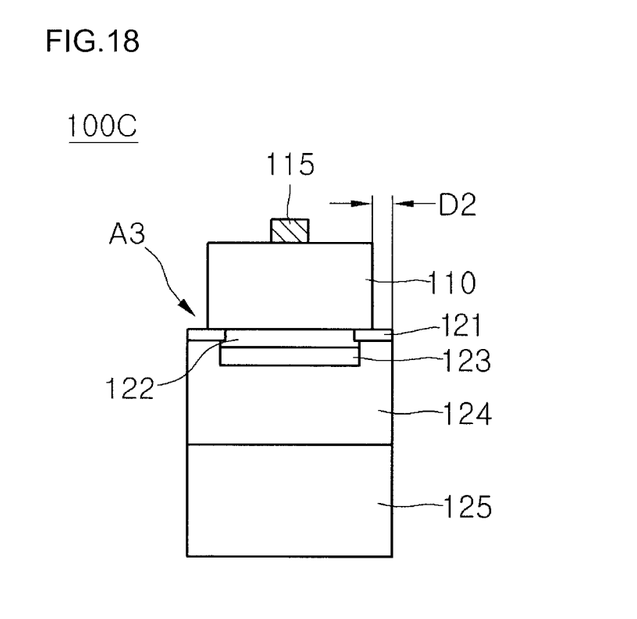
FIG. 18 is a side sectional view showing a light emitting device according to a fourth embodiment.

FIG. 18 is a side sectional view showing a light emitting device 100C according to a fourth embodiment. Hereinafter, the fourth embodiment will be described while focusing on the difference between the disclosed embodiments and the fourth embodiment.

Referring to FIG. 18, in the light emitting device 100C, a spacer A3 is formed around a peripheral portion of the compound semiconductor layer 110. The spacer A3 spaces an outer portion of the compound semiconductor layer 110 from a line extending an outer portion of the conductive support member 125 with a predetermined distance D1. The spacer A3 widens the gap between the compound semiconductor layer 110 and the bonding layer 124.

The bonding layer 124 may be provided under the channel layer 121.

Figure 19:
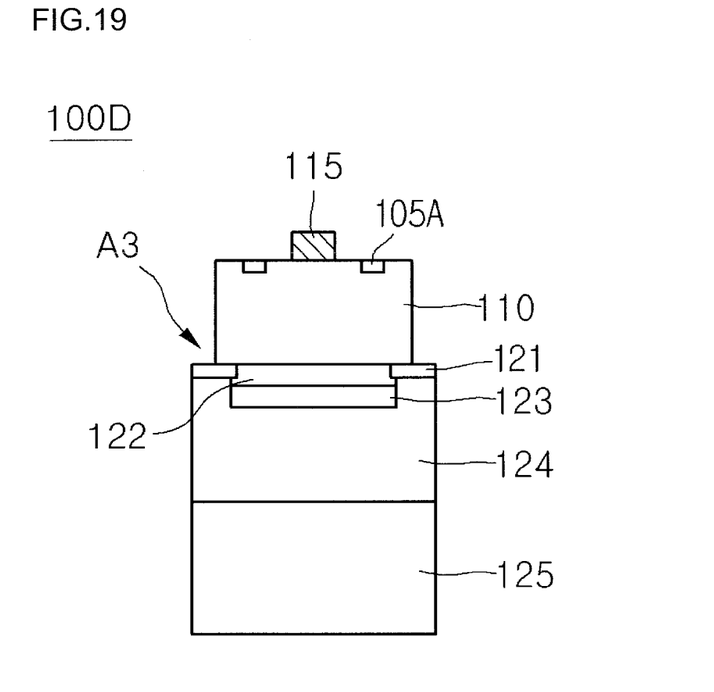
FIG. 19 is a side sectional view showing a light emitting device according to a fifth embodiment.

FIG. 19 is a side sectional view showing a light emitting device 100D according to a fifth embodiment. Hereinafter, the fifth embodiment will be described while focusing on the difference between the disclosed embodiments and the fifth embodiment.

Referring to FIG. 19, in the light emitting device 100D, the spacer A3 is formed around a peripheral portion of the compound semiconductor layer 110. A groove 105A may be formed on a top surface of the compound semiconductor layer 110.

The groove 105A may have at least one pattern at an inner part of the top surface of the compound semiconductor layer 110. The pattern may be different from patterns disclosed in FIGS. 3 to 6.

The interval between the grooves 105A is set suitably for laser scanning, and the grooves 105A may be the overlapping region for the laser scanning. In the case of a chip having a large area, the groove 105A may be provided. If the size of the chip is greater than the size of a scan area of a laser, the groove 105A may be provided on the top surface of the compound semiconductor layer 110. The groove 105A may be provided with an oxide layer, or may be removed through etching or polishing.

An insulation material is disposed on the compound semiconductor layer 110 and disposed in the groove 105A.

Figure 20:
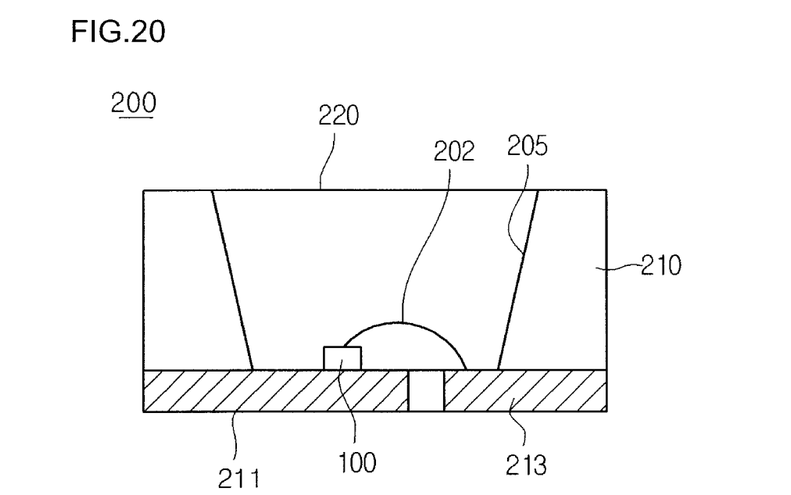
FIG. 20 is a side sectional view showing a light emitting device package according to a sixth embodiment.

FIG. 20 is a side sectional view showing a light emitting device package 200 according to a sixth embodiment.

Referring to FIG. 20, the light emitting device package 200 includes a body 210, first and second lead electrodes 211 and 213 installed in the body 210, the light emitting device 100 according to the embodiment installed in the body 210 and electrically connected with the first and second lead electrodes 211 and 213, and a molding member 220 surrounding the light emitting device 100.

The body 210 may include a silicon, synthetic resin, or metallic material. The body 210 may include a cavity 205 having an inclined surface around the light emitting device 100.

The first and second lead electrodes 211 and 213 are insulated from each other, and supply power to the light emitting device 100. The first and second lead electrodes 211 and 213 reflect light emitted from the light emitting device 100 such that light efficiency can be increased. The first and second lead electrodes 211 and 213 can discharge heat from the light emitting device 100 to the outside.

The light emitting device 100 may be installed on the body 210, or on the first lead electrode 211 or the second lead electrode 213.

The molding member 220 can protect the light emitting device 100 by surrounding the light emitting device 100. The molding member 220 includes a phosphor to change the wavelength of light emitted from the light emitting device 100.

The light emitting device 100 according to the embodiment (embodiments) is connected to the first and second lead electrodes 211 and 213, and then is packaged, so that the light emitting device 100 serves as a light source for an indication device, an illumination device, a display device, and the like. Each embodiment can be selectively adapted to another embodiment.

The light emitting device or the light emitting device package according to the embodiment can be adapted to an illumination system. The lighting system includes a lighting unit shown in FIG. 21, and a backlight unit shown in FIG. 22. The lighting system may be included in a traffic light, a street lamp, a head lamp of a vehicle, or a signboard lamp.

Figure 21:
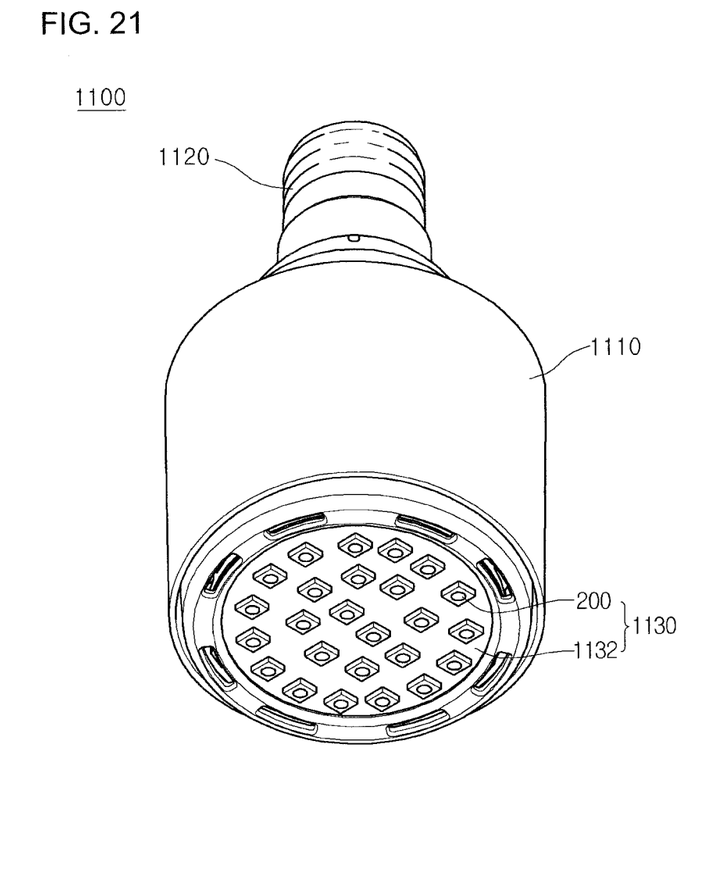
FIG. 21 is a view showing an lighting unit according to an embodiment.

FIG. 21 is a perspective view showing a light unit according to the embodiment.

Referring to FIG. 21, the light unit 1100 includes a case 1110, a light emitting module 1130 installed in the case 1110, and a connector 1120 installed in the case 1110 to receive power from an external power supply.

Preferably, the case 1110 may include a material having a superior heat sink characteristic, and may include a metallic material or a resin material.

The light emitting module 1130 may include a board 1132 and at least one light emitting device package 1210 mounted on the board 1132. The light emitting device package 1210 may include a light emitting device according to the embodiment.

The board 1132 may be formed by printing a circuit pattern on an insulator. For example, the board 1132 may include a printed circuit board (PCB), a metal core PCB, a flexible PCB, or a ceramic PCB.

The board 1132 may include a material to effectively reflect light. The surface of the board 1132 may have a color, such as white or silver, to effectively reflect light.

At least one light emitting device package 1210 may be mounted on the board 1132. The light emitting device package 1210 may include at least one light emitting diode (LED) 100. The LED 100 may include a color light emitting diode to emit red, green, blue, or white light or an UV light emitting diode to emit ultraviolet ray.

The light emitting module 1130 may have the combination of various light emitting device packages 1210 in order to obtain desirable color and brightness. For example, the light emitting module 1130 may have the combination of white, red, and green light emitting diodes in order to ensure a high color rendering index (CRI).

The connector 1120 is electrically connected with the light emitting module 1130 to supply power to the light emitting module 1130. The connector 1120 is coupled with an external power supply through a socket scheme, but the embodiment is not limited thereto. For example, the connector 1120 has the form of a pin so that the connector 1120 is inserted into the external power supply or connected with the external power supply by using a wire.

Figure 22:
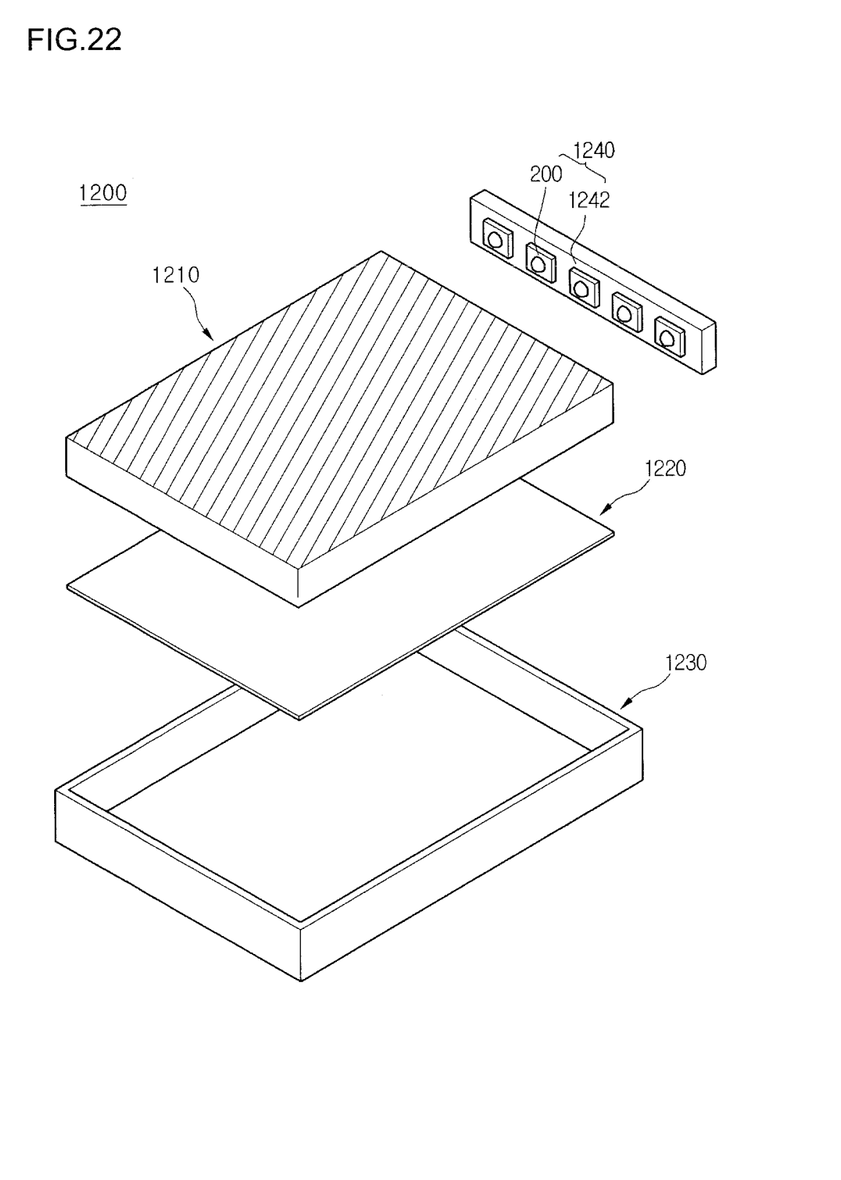
FIG. 22 is a view showing a backlight unit according to the embodiment.

FIG. 22 is an exploded perspective view showing a backlight unit 1200 according to the embodiment.

Referring to FIG. 22, the backlight unit 1200 includes a light guide plate 1210, a light emitting module 1240 to supply light to the light guide plate 1210, a reflective member 1220 provided under the light guide plate 1210, and a bottom cover 1230 to receive the light guide plate 1210, the light emitting module 1240, and the reflective member 1220.

The light guide plate 1210 diffuses light to serve as a surface light source. The light guide plate 1210 includes a transparent material. For example, the light guide plate 1210 includes one of acrylic resin-based material such as polymethyl methacrylate (PMMA), polyethylene terephthalate (PET), poly carbonate (PC), cycloolefin copolymer (COC), and polyethylene naphthalate (PEN).

The light emitting module 1240 supplies light to at least one side of the light guide plate 1210, and serves as a light source of a display apparatus having the backlight unit.

The light emitting module 1240 may make contact with the light guide plate 1210, but the embodiment is not limited thereto. In detail, the light emitting module 1240 includes a board 1242 and a plurality of light emitting packages 200 mounted on the board 1242, and the board 1242 may make contact with the light guide plate 1210, but the embodiment is not limited thereto.

The board 1242 may be a printed circuit board (PCB) including a circuit pattern (not shown). The board 1242 may include a metal core PCB and a flexible PCB as well as a typical PCB, but the embodiment is not limited thereto.

The light emitting device packages 200 may be mounted on the board 1242 such that a light emission surface of each light emitting device package 200 is spaced apart from the light guide plate 1210 with a predetermined distance.

The reflective member 1220 may be formed under the light guide plate 1210. The reflective member 1220 upwardly reflects light which has been incident downward from the light guide plate 1210, thereby improving the brightness of a backlight unit. The reflective member 1220 may include PET, PC, or PVC resin, but the embodiment is not limited thereto.

The bottom cover 1230 may receive the light guide plate 1210, the light emitting module 1240, and the reflective member 1220. To this end, the bottom cover 1230 has the shape of a box, a top surface of which is open, but the embodiment is not limited thereto.

The bottom cover 1230 may include a metallic material or a resin material, and may be manufactured through press molding or extrusion molding.

According to the embodiment, the chip reliability for the light emitting device can be improved, and the defect rate of a semiconductor chip can be improved.

A light emitting device comprises a first conductive semiconductor layer; an active layer under the first conductive semiconductor layer; a second conductive semiconductor layer under the active layer; a first electrode over the first conductive semiconductor layer; at least one groove formed on an upper surface of the first conductive semiconductor layer; a material having a band gap in a range of 2.5 eV to 3.0 eV provided in the groove; and a second electrode layer under the second conductive semiconductor layer.

A light emitting device comprises: a first conductive semiconductor layer, wherein the first conductive material has a first width and a second width, and a difference in width of the first and second width is no greater than 100 um, and the difference in width forms a step profile or a slanted profile around a periphery of the first semiconductor layer; an active layer under the first conductive semiconductor layer; a second conductive semiconductor layer under the active layer; a first electrode over the first conductive semiconductor layer; and a second electrode layer under the second conductive semiconductor layer. The difference is no greater than 50 um.

An embodiment provides a method of manufacturing a light emitting device comprising: forming oxide layers spaced apart from each other with a first interval and having a first band gap on a substrate; forming a plurality of compound semiconductor layers having a second band gap higher than the first band gap on the substrate; forming an electrode layer on the compound semiconductor layers; separating the substrate by irradiating a laser beam to the substrate; etching the compound semiconductor layers after the substrate has been separated; and dividing the electrode layer in a chip size along an etched region.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   an active layer under the first conductive semiconductor layer;
   a second conductive semiconductor layer under the active layer;
   a first electrode over the first conductive semiconductor layer;
   at least one groove around a peripheral portion of a top surface of the first conductive semiconductor layer;
   a material provided in the groove, the material having a band gap in a range of 2.5 eV to 3.0 eV;
   a support member under the second conductive semiconductor layer; and
   a second electrode layer between the second conductive semiconductor layer and the support member.

2. The light emitting device of claim 1, wherein the at least one groove has a prescribed shape around the peripheral portion of the top surface of the first conductive semiconductor layer.

3. The light emitting device of claim 2, wherein the prescribed shape is substantially rectangular.

4. The light emitting device of claim 1, wherein the material is a light transmissive material.

5. The light emitting device of claim 4, wherein the light transmissive material layer includes at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, SiOxNy, Si3N4, Al2O3, or TiO2.

6. The light emitting device of claim 1, wherein the at least one groove is formed along a peripheral portion of an upper surface of the first conductive semiconductor layer.

7. The light emitting device of claim 1, wherein the material comprises an oxide.

8. The light emitting device of claim 1, wherein the material is one of tungsten oxide and molybdenum oxide.

9. The light emitting device of claim 1, wherein the at least one groove has a thickness in a range of 0.01 μm to 1.0 μm.

10. The light emitting device of claim 1, further comprising at least one of a channel layer, an ohmic layer, and a current blocking layer between the second conductive semiconductor layer and the second electrode layer,
   wherein the channel layer vertically overlaps with the at least one groove.

11. The light emitting device of claim 1, wherein the first conductive semiconductor layer is an N-type semiconductor layer, and the second conductive semiconductor layer is a P-type semiconductor layer.

12. The light emitting device of claim 1, wherein at least one of the first conductive semiconductor layer, the active layer or the second semiconductor layer is made of $In_xAl_yGa_{1-x-y}N$ ($0 \leq x \leq 1$, $0 \leq y \leq 1$, $0 \leq x+y \leq 1$).

13. The light emitting device of claim 1, wherein the at least one groove has a conical shape or a pyramid shape.

14. The light emitting device of claim 1, wherein the at least one groove is fonjied of a continuous loop shape in the first conductive semiconductor layer.

15. The light emitting device of claim 1, wherein the at least one groove has a width in a range of 0.01 μm to 100 μm.

16. The light emitting device of claim 1, wherein the band gap of the material is less than a band gap of the first conductive semiconductor layer.

17. The light emitting device of claim 1, wherein the at least one groove has a bottom surface therein configured to substantially contact a side surface of the first conductive semiconductor layer.

18. A light emitting device comprising:
   a compound semiconductor layer;
   a first electrode over the compound semiconductor layer;
   at least one groove around a peripheral portion of a top surface of the compound semiconductor layer;
   a material provided in the groove, the material having a band gap less than a band gap of the compound semiconductor layer;
   a support member under the compound semiconductor layer; and
   a second electrode layer between the compound semiconductor layer and the support member.

19. The light emitting device of claim 18, wherein the band gap of the material is in a range of 2.5 eV to 3.0 eV.

20. The light emitting device of claim 18, further comprising at least one of a channel layer, an ohmic layer, and a current blocking layer between the compound semiconductor layer and the second electrode layer,
   wherein the channel layer vertically overlaps with the at least one groove.

* * * * *